United States Patent [19]

Nilssen

[11] Patent Number: 4,857,806
[45] Date of Patent: Aug. 15, 1989

[54] SELF-BALLASTED SCREW-IN FLUORESCENT LAMP

[76] Inventor: Ole K. Nilssen, Caesar Dr., Rte. 5, Barrington, Ill. 60010

[21] Appl. No.: 20,478

[22] Filed: Mar. 2, 1987

Related U.S. Application Data

[60] Continuation-in-part of Ser. No. 262,542, May 5, 1981, Pat. No. 4,677,345, which is a division of Ser. No. 178,107, Aug. 14, 1980, abandoned.

[51] Int. Cl.[4] .............................................. H01J 7/44
[52] U.S. Cl. ........................................ 315/72; 315/56; 315/58; 315/244; 315/DIG. 5
[58] Field of Search ............... 315/200 R, 232, 227 R, 315/242, 241 R, 243, DIG. 5, DIG. 7, 53, 209, 219, 220, 276, 278, 279, 72, 56-58; 331/113 A

[56] References Cited

U.S. PATENT DOCUMENTS

| | | | |
|---|---|---|---|
| Re. 31,758 | 1/1980 | Nilssen | 315/220 |
| 3,521,120 | 7/1970 | Anderson | 315/57 |
| 3,691,450 | 9/1972 | Cox | 315/219 |
| 3,769,545 | 10/1973 | Crane | 315/219 |
| 4,045,711 | 8/1977 | Pitel | 315/DIG. 5 |
| 4,051,413 | 9/1977 | Abadie | 315/219 |
| 4,060,751 | 11/1977 | Anderson | 315/239 |
| 4,075,476 | 2/1978 | Pitel | 315/205 |
| 4,158,156 | 6/1979 | Knoll | 315/DIG. 5 |
| 4,199,710 | 4/1980 | Knoll | 315/220 |
| 4,207,497 | 6/1980 | Capewell et al. | 315/223 |
| 4,237,403 | 12/1980 | Davis | 315/DIG. 5 |
| 4,277,726 | 7/1981 | Burke | 315/DIG. 5 |
| 4,300,073 | 11/1981 | Skwirut et al. | 315/50 |
| 4,353,009 | 10/1982 | Knoll | 315/224 |
| 4,367,434 | 1/1983 | Miller | 315/DIG. 5 |
| 4,389,595 | 6/1983 | Kamei et al. | 315/50 |
| 4,392,085 | 7/1983 | Knoll et al. | 315/DIG. 5 |
| 4,438,372 | 3/1984 | Zuchtriegel | 315/242 X |
| 4,513,364 | 4/1984 | Nilssen | 315/219 |
| 4,581,562 | 4/1986 | Nilssen | 315/219 |

Primary Examiner—James J. Groody
Assistant Examiner—Mark R. Powell

[57] ABSTRACT

A fluorescent lamp is mounted on an ordinary Edison-type screw-base; which screw-base contains a frequency-converting electronic ballast. The combined lamp-ballast-assembly is adapted to be used in an ordinary screw-in lamp socket powered from ordinary 120 Volt/60 Hz power line voltage. The frequency-converting ballast within the screw-base converts the 120 Volt/60 Hz power line voltage to a high-frequency (20–30 kHz) substantially sinusoidal current, which is then used for powering the compact fluorescent lamp.

21 Claims, 1 Drawing Sheet

U.S. Patent     Aug. 15, 1989     4,857,806
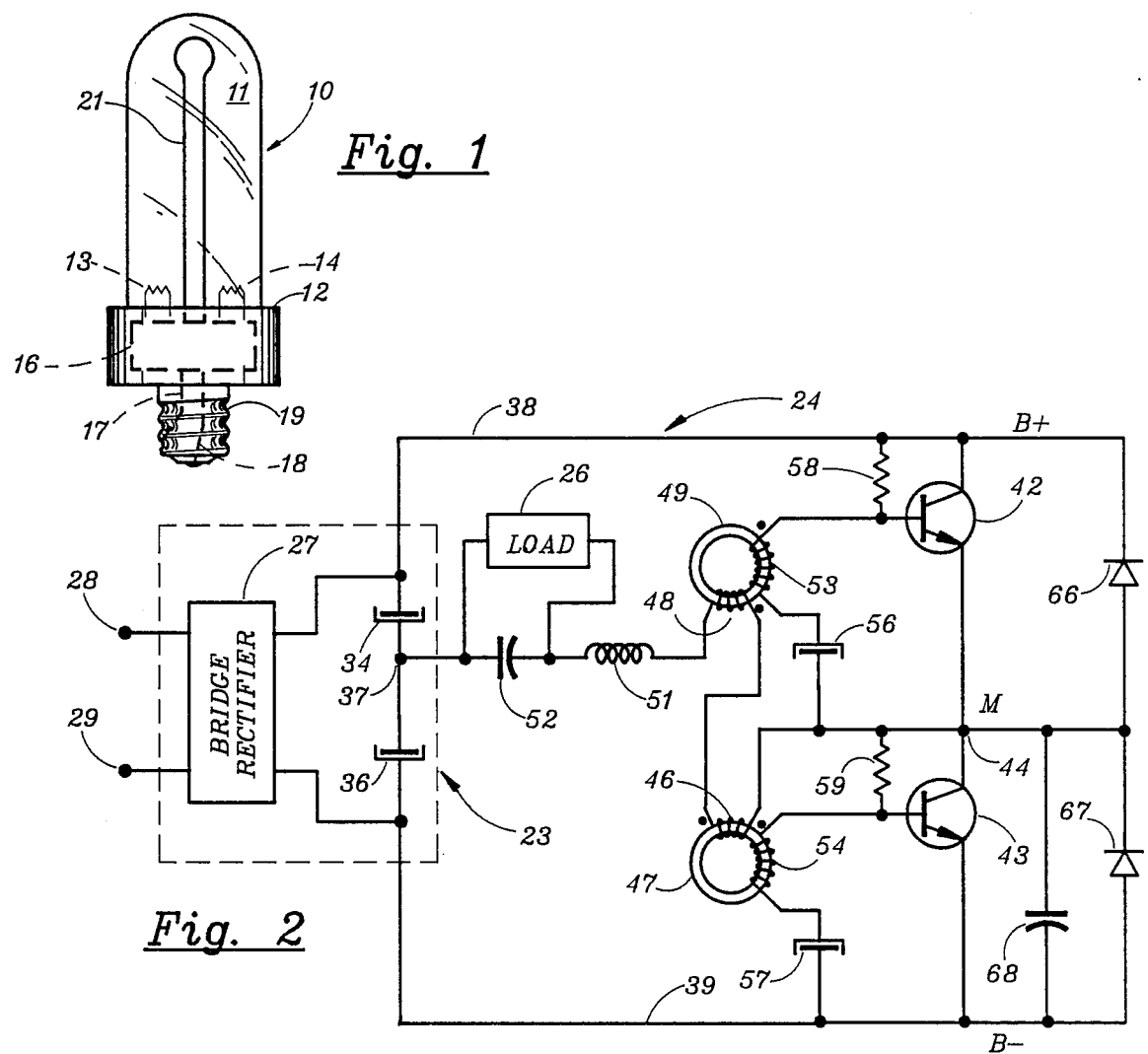
Fig. 1
Fig. 2
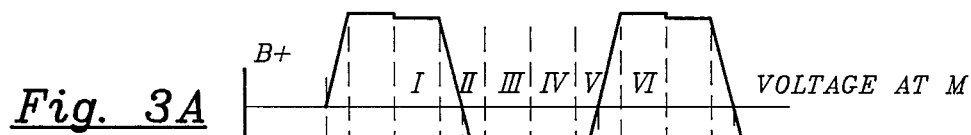
Fig. 3A — VOLTAGE AT M
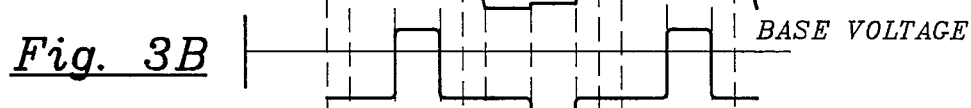
Fig. 3B — BASE VOLTAGE
Fig. 3C — TRANSISTOR CURRENT
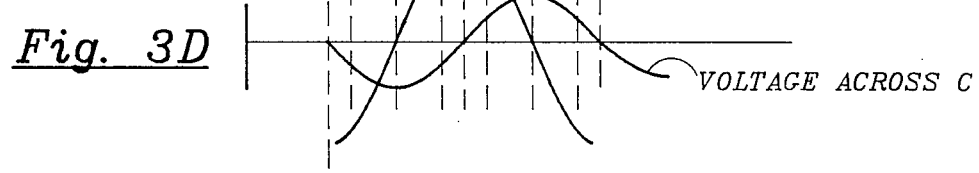
Fig. 3D — CURRENT THROUGH L / VOLTAGE ACROSS C

SELF-BALLASTED SCREW-IN FLUORESCENT LAMP

BACKGROUND OF THE INVENTION

RELATED APPLICATION

The present application is a Continuation-in-Part of Ser. No. 262,542 filed May 5, 1981 now pat. no. 4,677,345; which is a division of Ser. No. 178,107 filed Aug. 14, 1980, now abandoned.

FIELD OF INVENTION

The present invention relates to compact light-weight self-ballasted fluorescent lamps operable to be screwed directly into and properly powered by an ordinary Edison-type lamp socket connected with 120Volt/60Hz power line voltage.

SUMMARY OF THE INVENTION

OBJECT OF THE INVENTION

An object of the present invention is that of providing a compact self-ballasted screw-in fluorescent lamp assembly operable to be used in an ordinary Edison-type lamp socket.

This as well as other objects, features and advantages of the present invention will become apparent from the following description and claims.

BRIEF DESCRIPTION

In its preferred embodiment, the present invention comprises a compact folded fluorescent lamp mounted on a base-structure adapted to be screwed into and held by an orindary Edison-type lamp socket. The base-structure comprises frequency-converting power supply means operative to be powered fromm the 120Volt/60Hz power line voltage received from the lamp socket and to provide an output to the fluorescent lamp in the form of a relatively high-frequency substantially sinusoidal current. The frequency-converting power supply supply comprises rectifier means operative to convert the 120Volt/60Hz power line voltage into a DC voltage; which DC voltage, in turn, is fed to a half-bride inverter operative to provide a high-frequency substantially squarewave voltage across a series-resonant combination of an inductor and a capacitor. The fluorescent lamp, which is of the instant-start type, is connected in parallel with the capacitor and is therefore —by way of so-called Q-multiplication —provided with adequate starting voltage and, after ignition, with a substantially constant-magnitude current.

BRIEF DESCRIPTION OF THE DRAWINGS

FIG. 1 schematically illustrates the compact screw-in selfballasted fluorescent lamp assembly.

FIG. 2 is a schematic diagram of the frequency-converting power supply and ballasting circuit comprised within the base of the fluorescent lamp assembly.

FIG. 3 illustrates the waveforms of various voltages and current associated with the power supply and ballasting circuit of FIG. 2.

DESCRIPTION OF THE PREFERRED EMBODIMENT

FIG. 1 illustrates a screw-in gas discharge lamp unit 10 comprising a folded fluorescent lamp 11 secured to an integral base 12. The lamp comprises two cathodes 13, 14 which are supplied with the requisite high operating voltage from a frequency-converting power supply and ballasting circuit 16; which, because of its compact size, conveniently fits within base 12.

Circuit 16 is connected by leads 17, 18 to a screw-type plug 19 adapted for screw-in insertion into a standard Edisontype incandescent lamp socket at which ordinary 120Volt/60Hz power line voltage is available.

In FIG. 2, a power supply 23 is connected with the 120Volt/60Hz power line voltage and provides a center-tapped DC output voltage for supplying a high-efficiency half-bridge inverter circuit 24. The inverter circuit is operable to provide a high-frequency (20–30 kHz) high-magnitude current-limited voltage to a load 26, which actually represents fluorescent lamp 11 of FIG. 1.

Power supply 23 comprises bride rectifier 27 which connects with 120Volt/60Hz power line terminals 28, 29 and provides full-wave rectified power line voltage to two series-connected filter capacitors 34, 36; which filter capacitors are: i) connected together at a center-tap 37, and ii) connected between a positive B+bus 38 and a negative B- bus 39.

Inverter circuit 24 is a half-bride inverter comprising transistors 42, 43 connected in series between the B+bus and the B- bus. The collector of transistor 42 is connected to the B+bus 38, the emitter of transistor 42 and the collector of transistor 43 are connected to a midpoint line 44 ("M"), and the emitter of transistor 43 is connected to the B- bus 39.

Midpoint line 44 is connected to center-tap 37 through a primary winding 46 of a toroidal saturable core transformer 47, a primary winding 48 on an identical transformer 49, an inductor 51 and a series-connected capacitor 52. Inductor 51 and capacitor 52 are energized upon alternate transistor conduction in manner to be described later. Load 26 is connected in parallel with capacitor 52.

Drive current to the base terminals of transistors 42 and 43 is provided by secondary windings 53, 54 of transformers 49, 47, respectively. Winding 53 is also connected to midpoint line 44 through a bias capacitor 56, while winding 54 is connected to the B- bus 39 through an identical bias capacitor 57. The base terminals of transitors 42 and 43 are also connected to lines 38 and 44 through bias resistors 58 and 59, respectively. Shunt diodes 66 and 67 are connected across the collector-emitter terminals of transistors 42 and 43, respectively. Finally, a capacitor 68 is connected across the collector-emitter terminals of transistor 43 to restrain the rate of voltage rise across those terminals.

The operation of the circuit of FIG. 2 can best be understood with additional reference to FIG. 3, which illustrates significant portions of the waveforms of the voltage of midpoint M (FIG. 3A), the base-emitter voltage on transistor 42 (FIG. 3B), the current through transistor 42 (FIG. 3C), and the capacitor C voltage and the inductor 51 current (FIG. 3D).

Starting at a point where transistor 42 first starts to conduct, current flows from the B+bus 38 through windings 46 and 48 and inductor 51 to charge capacitor 52 and returns to the B+ bus through capacitor 34 (refer to the time period designated I in FIG. 3). When the saturable transformer 49 saturates at the end of period I, drive current to the base of transistor 42 will terminate, causing voltage on the base of the transistor to drop to the negative voltage stored on bias capacitor 56 in a manner to be described, causing this transistor to become non-conductive. As shown in FIG. 3c, current-flow in transistor 43 terminates at the end of period I.

However, since the current flowing through inductor 51 cannot change instantaneously, this current will now continue to flow from the B- bus 39 through capacitor 68, eventually causing the voltage at midpoint line 44 to drop to the voltage level on the B- bus (period II in FIG. 3). Thus, capacitor 68 restrains the rate of voltage change across the collector and emitter terminals of transistor 42.

The current through inductor 51 reaches it maximum value when the voltage at midpoint line 44 is zero. During period III, the current will continue to flow through inductor 51 but will be supplied from the B- bus through shunt diode 67. It will be appreciated that during the latter half of period II and all of period III, positive current is being drawn from a negative voltage; which, in reality, means that energy is being returned to the power supply through a path of relatively low impedance.

When the inductor current reaches zero at the start of period IV, the current through the primary winding 46 of the saturable inductor 47 will cause a current to flow out of its secondary winding 54 to cause transistor 43 to become conductive, thereby causeing a reversal in the direction of current through inductor 51 and capacitor 52. When transformer 47 saturates at the end of period IV, the drive current to the base of transistor 43 terminates and the current through inductor 51 will be supplied through capacitor 68, causing the voltage at midpoint 44 to rise (Period V). When the voltage at the midpoint line M reaches the voltage on the B+bus, the current will then flow through shunt diode 66 (period VI). The cycle is then repeated.

As seen in FIG. 3, saturable transformers 47, 49 provide transistor drive current only after the current through inductor 51 has diminished to zero. Further, the the transistor drive current is terminated before the current through inductor 51 has reached its maximum amplitude. This coordination of base drive current and inductor current is achieved because of the series-connection between the inductor 51 and the primary windings 46, 48 of saturable transformers 47, 49, respectively.

The series-connected combination of inductor 51 and capacitor 52 is energized upon the alternate conduction of transistors 42 and 43. With a large value of capacitance of capacitor 52, very little voltage will be developed across its terminals. As the value of this capacitance is decreased, however, the voltage across the capacitor will increae. As the value of capacitor 52 is reduced to achieve resonance with inductor 51, the voltage on the capacitor will rise and become infinite in a loss-free circuit operating under ideal conditions.

It has been found desirable to regulate the transistor inversion frequency, determined mainly by the saturation time of saturable transformers 47, 49, to be equel to or higher than the natural resonance frequency of the inductor and capacitor combination in order to provide a high voltage output to external load 26.

Due to so-called Q-multiplication, a high-magnitude voltage develops across capacitor 52 as the transistor inversion frequency approaches the natural resonance frequency of the series-combination of inducator 51 and capacitor 52.

When invertor circuit 24 is used in the self-ballasted fluorescent lamp of FIG. 1, it has been found that the inversion frequency may be about equal to the natural resonance frequency of the series L-C tank circuit consisting of inductor 51 and capacitor 52. However, if the capacitance value of capacitor 52 is reduced below the point of resonance, unacceptably high transistor currents will result and transistor burn-out will occur.

The sizing of capacitor 52 is determined by the particular application of inverter circuit 24; but, as long as the combined load presented to the output of inverter transistors 42, 43, has an effective inductance value sufficient to provide adequate energy storage for self-sustained transistor inverter action, the current-feedback provided by saturable transformers 47, 49 will effect alternate transistor conduction without the need for additional voltage-feedback.

Because the voltages across transistors 42, 43 are relatively low (due to the absolute voltage-clamping effect of capacitors 34, 36), the half-bridge inverter 24 is very reliable. The absence of switching transients minimizes the possibility of transistor burn-out.

Inverter circuit 24 comprises means for supplying reverse bias to the conducting transistor upon saturation of its associated saturable transformer. For this purpose, capacitors 56 and 57 are charged to negative voltages as a result of reset currents flowing into secondary windings 53, 54 from the bases of transistors 42, 43, respectively. This reverse current rapidly turns off a conducting transistor to increase its switching speed and to achieve high invertor switching efficiency.

When a transistor base-emitter junction is reversely biased, it exhibits the characteristics of a Zener diode, having a reverse breakdown voltage on the order of 8 to 14 Volt for transistors typically used in high-voltage inverters.

Since load 56 comprises a fluorescent lamp, the maximum magnitude of the voltage across capacitor 52 will be limited by the lamp's ignition and operating characteristics, thereby effectively preventing voltages across inductor 51 and capacitor 52 from ever reaching destructive levels.

ADDITIONAL EXPLANATIONS AND COMMENTS (a) With commonly available components, inverter circuit 24 can be made to operate efficiently at any frequency between a few kHz to perhaps as high as 50 kHz. However, for various well-known reasons (i.e., eliminating audible noise, minimizing physical size, and maximizing efficiency), the frequency actually chosen for the lamp unit of FIG. 1 was in the range of 20 to 30 kHz.

(b) The fluorescent lighting unit of FIG. 1 could be made in such manner as to permit fluorescent lamp 11 to be disconnectable from its base 12 and ballasting means 16. However, if powered with normal line voltage without its lamp load connected, frequency-converting power supply and ballasting circuit 16 is apt to self-destruct.

To avoid such self-destruction, arrangements can readily be made whereby the very act of removing the load automatically establishes a situation that prevents the possible destruction of the power supply and ballasting means. For instance, with the tank capacitor (52) being permanently connected with the lamp load (11) —thereby automatically being removed whenever the lamp is removed —the inverter circuit is protected from self-destruction.

(c) At frequencies above a few kHz, the load represented by a fluorescent lamp —once it is ignited —is substantially resistive. Thus, with the voltage across lamp 11 being of a substantially sinusoidal waveform (as indicated in FIG. 3d), the current through the lamp will also be substantially sinusoidal in waveshape.

(d) In the fluorescent lamp unit of FIG. 1, fluorescent lamp 11 is connected with power supply and ballasting circuit 16 in the exact same manner as is load 26 connected with the circuit of FIG. 2. That is, it is connected in parallel with the tank capacitor (52) of the L-C series-resonant circuit. As is conventional in instant-start fluorescent lamps —such as lamp 11 of FIG. 1 —the two terminals from each cathode are shorted together, thereby to constitute a situation where each cathode effectively is represented by only a single terminal. However, it is not necessary that the two terminals from each cathode be shorted together; in which case —for instant-start operation —connection from a lamp's power supply and ballasting means need only be made with one of the terminals of each cathode.

(d) It is thought that the present invention and many of its attendant advantages will be understood from the foregoing description and that many changes may be made in the form and construction of its components parts, the form described being merely a preferred embodiment of the invention.

I claim:

1. An arrangement comprising:
gas discharge lamp means having lamp terminals;
frequency-converting power supply and ballasting means having input terminals and output terminals, the output terminals being: (i) connected with the lamp terminals, and (ii) operative, whenever either an AC voltage or a DC voltage of magnitude about equal to that of an ordinary power line voltage is applied to the input terminals, to provide operating voltage to the lamp terminals, the frequency of the operating voltage being different from that of the ordinary power line voltage; and
base means operative to rigidly and non-detachably hold together the lamp means and the frequency-converting power supply and ballasting means, thereby to form an integral lamp unit, the base means having: (i) a screw base operative to be screwed into and held by an ordinary Edison-type lamp socket, the lamp socket having socket electrodes, and (ii) electrode means connected with the input terminals and operative, after the base means having been screwed into the Edison-type lamp socket, to make contact with the socket electrodes.

2. An arrangement comprising:
gas discharge lamp means having lamp terminals, which, for optimally effective lamp operation, must be supplied with an operating voltage of frequency different from that of the power line voltage normally present on an ordinary electric utility power line;
frequency-converting power supply and ballasting means having input terminals and output terminals, the output terminals being connected with the lamp terminals and being operative, whenever either an AC voltage or a DC voltage of magnitude about equal to that of ordinary power line voltage is applied to the input terminals, to provide the operating voltage thereto; and
base means operative to ridigly and non-detachably hold together the lamp means and the frequency-converting power supply and ballasting means, thereby to form an integral lamp unit, the base means having: (i) a screw base operative to be screwed into and held by an ordinary Edison-type lamp socket, the lamp socket having socket electrodes, and (ii) electrode means connected with the input terminals and operative, after the base means having been screwed into the Edison-type lamp socket, to make contact with the socket electrodes.

3. An arrangement comprising:
gas discharge lamp means having lamp terminals;
rectifier means having AC input terminals and DC output terminals, a DC voltage being supplied at the DC output terminals in response to the provision at the AC input terminals of either an AC voltage or a DC voltage of magnitude about equal to that of the power line voltage normally present on an ordinary electric utility power line;
inverter means connected with the DC output terminals and operative to provide a high-frequency output voltage at a set of high-frequency output terminals, the frequency of the high-frequency output voltage being substantially higher than that of the power line voltage present on an ordinary electric utility power line;
L-C tank circuit means connected with the high-frequency output terminals and operative to resonantly interact with the high-frequency output voltage provided thereat, the L-C tank circuit having a tank inductor and a tank capacitor, the gas discharge lamp means being effectively connected in parallel with the tank capacitor; and
base means operative to hold together the gas discharge lamp means, the recitifier means, the inverter means and the L-C tank circuit means, thereby to form an integral lamp unit having no detachable parts, the base means having: (i) a screw base operative to be screwed into and to be held by an ordinary Edison-type lamp socket, the lamp socket having socket electrodes at which is sometimes provided the power line voltage present on an ordinary electric utility power line, the (ii) electrode means connected with the AC input terminals and operative, after the base means having been screwed into the Edison-type lamp socket, to make contact with the socket electrodes;
whereby the lamp unit can be screwed into and be held by an ordinary Edison-type lamp socket, thereby to be properly powered from the power line voltage sometimes provided at the socket electrodes thereof.

4. The arrangement of claim 3 wherein: (i) the L-C tank circuit comprises a series-combination of an inductor and a capacitor, and (ii) this series-combination is series-resonant at or near the frequency of the high-frequency output voltage.

5. An arrangement comprising:
power supply means having input terminals and output terminals, an AC output voltage being provided at the output terminals whenever the input terminals are provided with either an AC or DC voltage of magnitude about equal to the power line voltage normally present at an ordinary electric utility power line;
a series-combination of an inductor and a capacitor connected across the output terminals and constituted such as to exhibit series-resonant action at or near the fundamental frequency of the AC output voltage;

gas discharge lamp means having a set of lamp terminals connected in parallel circuit with the capacitor, thereby to constitute a load as well as an overload protection means for the series-resonant series-combination; and base means operative to non-detachably hold together the power supply means, the series-combination, and the gas discharge lamp means, thereby to form an integral lamp unit, the base means having: (i) a screw base operative to be screwed into and to be held by an ordinary Edison-type lamp socket, the lamp socket having socket electrodes at which is sometimes provided the power line voltage from an ordinary electric utility power line, and (ii) electrode means connected with the input terminals and operative, after the base means having been screwed into the Edison-type lamp socket, to make contact with the socket electrodes;

such that the lamp unit can be screwed into and be held by an ordinary Edison-type lamp socket, thereby to be properly powered from the power line voltage sometimes provided at the socket electrodes thereof.

6. The arrangement of claim 5 wherein the power supply means comprises:

rectifier means connected with the input terminals and operative, whenever the power line voltage is supplied thereto, to provide a DC voltage at a center-tapped DC output;

half-bride inverter means connected between the centertapped DC output and the output terminals, the half-bridge inverter means being operative to convert the DC voltage to the AC output voltage.

7. The arrangement of claim 5 wherein the AC output voltage is characterized as having a fundamental frequency that is different from that of the power line voltage.

8. The arrangement of claim 1 wherein the frequency-converting power supply and ballasting means comprises: (i) recitifer means connected with the input terminals and operative to provide a DC voltage at a set of DC terminals, and (ii) inverter means connected with the DC terminals and operative to provide to the output terminals a current of substantially sinusoidal waveshape.

9. The arrangement of claim 1 wherein the frequency-converting power supply and ballasting means comprises: (i) rectifier means connected with the input terminals and operative to provide a DC voltage at a set of DC terminals, and (ii) inverter means connected with the DC terminals and operative to provide to the output terminals a voltage of substantially sinusoidal waveshape.

10. The arrangement of claim 1 wherein the frequency-converting power supply and ballasting means comprises: (i) rectifier means connected with the input terminals and operative to provide a DC voltage at a set of DC terminals, and (ii) inverter means connected with the DC terminals and operative to provide to the output terminals a voltage suitable for starting and operating the gas discharge lamp, the inverter means having a pair of transistors series-connected across the DC terminals.

11. The arrangement of claim 1 wherein the frequency-converting power supply and ballasting means comprises: (i) rectifier means connected with the input terminals and operative to provide a DC voltage at a set of DC terminals, and (ii) inverter means connected with the DC terminals and operative to provide to the output terminals a voltage suitable for starting and operating the gas discharge lamp, the inverter means having transistor means operative to oscillate by way of positive feedback administered by way of saturable inductor means.

12. The arrangement of claim 5 wherein an AC load voltage is present across the capacitor, which AC load voltage is of substantially sinusoidal waveshape.

13. The arrangement of claim 5 wherein the AC output voltage may reasonably be characterized as being a squarewave voltage.

14. The arrangement of claim 6 wherein the half-bridge inverter means is made to oscillate by way of positive feedback administered by way of a saturable inductor means.

15. A screw-in lamp unit comprising:

gas discharge lamp means having lamp terminals;

frequency-converting ballasting means having input terminals and output terminals; the output terminals being: (i) connected with the lamp terminals; and (ii) operative, whenever an AC voltage or, alternatively, a DC voltage of magnitude about equal to that of the power line voltage normally present at an ordinary electric utiity power line is applied to the input terminals, to provide operating voltage to the lamp terminals; the frequency of the operating voltage being different from that of the power line voltage; the waveshape of the operating voltage being substantially sinusoidal; and screw base means operative to hold together the lamp means and the frequency-converting ballasting means, thereby to form the screw-in lamp unit; the screw base means having: (i) a screw base operative to be screwed into and held by an ordinary Edison-type lamp socket, the lamp socket having socket electrodes; and (ii) electrode means connected with the input terminals and operative, after the screw base means having been screwed into the Edison-type lamp socket, to make contact with the socket electrodes;

whereby the screw-in lamp unit is operative to be properly powered from: (i) the power line voltage present on an ordinary electric utility power line; and (ii) alternatively, from a DC voltage of magnitude about equal to that of this power line voltage.

16. The screw-in lamp unit of claim 15 wherein:

the frequency of the operating voltage is substantially higher than that of the power line voltage; and the frequency-converting power supply includes: (i) inverter means connected in circuit with the input terminals and operative to provide a high-frequency inverter voltage at a set of inverter terminals; and (ii) tuned L-C circuit resonant at or near the fundamental frequency of the high-frequency inverter voltage, the tuned L-C circuit being connected between the inverter terminals and the output terminals.

17. A combination comprising:

gas discharge lamp means having lamp terminals;

rectifier means having power input terminals and DC output terminals; an output DC voltage being supplied at the DC output terminals in response to the provision at the power input terminals of an input AC voltage or, alternatively, an input DC voltage of magnitude about equal to that of the power line voltage normally present on an ordinary electric utility power line;

inverter means connected with the DC output terminals and operative to provide a high-frequency output current from a set of high-frequency output terminals; the inverter means including a transistor operative to conduct current in response to a control voltage provided at a control input; the frequency of the high-frequency output current being substantially higher than that of the power line voltage present on an ordinary electric utility power line; and L-C circuit means connected in circuit between the high-frequency output terminals and the lamp terminals; the L-c circuit means being operative to cause a sinusoidal high-frequency voltage to be present across the lamp terminals; the high-frequency voltage having a cycle period;

the combination being so arranged as to cause the transistor to conduct current for a brief span of time once during each cycle period of the high-frequency voltage; the duration of the brief span of time being about equal to or shorter than one quarter of the cycle period.

18. The combination of claim 17 wherein: (i) the L-C circuit means includes a tank-capacitor and a tank-inductor effectively series-connected across the high-frequency output terminals; (ii) the tank-inductor and tank-capacitor being operative to resonantly interact at the frequency of the highfrequency output current; and (iii) the lamp terminals are effectively connected in parallel with the tank-capacitor.

19. The combination of claim 17 arranged to be integrated with a screw-in lamp base having base terminals, thereby to form a screw-in lamp unit; the base terminals being connected with the power input terminals.

20. A combination comprising:

gas discharge lamp means having lamp terminals;

rectifier means having power input terminals and DC output terminals; an output DC voltage being supplied at the DC output terminals in response to the provision at the power input terminals of an input AC voltage or, alternatively, an input DC voltage of magnitude about equal to that of the power line voltage normally present on an ordinary electric utility power line;

inverter means connected with the DC output terminals and operative to provide a high-frequency output current from a set of high-frequency output terminals; the inverter means including a transistor operative to conduct current in response to a control voltage provided at a control input; the frequency of the high-frequency output current being substantially higher than that of the power line voltage present on an ordinary electric utility power line; and L-C means connected in circuit between the high-frequency output terminals and the lamp terminals; the L-C means having a tank-inductor and a tank-capacitor; the L-C means being operative to cause a first substantially sinusoidal high-frequency voltage to be present across the tank-capacitor; the lamp terminals being effectively connected in parallel with the tank-capacitor, thereby to cause a second substantially sinusoidal high-frequency voltage to be provided across the lamp terminals; the first and the second high-frequency voltage being approximately of the same frequency, phase and period;

the combination being so arranged as to cause the transistor to conduct current for a brief span of time once during each period; the duration of the brief span of time being shorter than half that of the period.

21. The combination of claim 20 wherein the tank-inductor and the tank-capacitor are: (i) effectively series-connected across the high-frequency output terminals; and (ii) operative to resonantly interact at the frequency of the high-frequency output current.

* * * * *

(12) EX PARTE REEXAMINATION CERTIFICATE (6269th)
United States Patent
Nilssen

(10) Number: US 4,857,806 C1
(45) Certificate Issued: Jun. 24, 2008

(54) SELF-BALLASTED SCREW-IN FLUORESCENT LAMP

(76) Inventor: Ole K. Nilssen, Caesar Dr., Rte. 5, Barrington, IL (US) 60010

Reexamination Request:
No. 90/007,470, Mar. 18, 2005

Reexamination Certificate for:
Patent No.: 4,857,806
Issued: Aug. 15, 1989
Appl. No.: 07/020,478
Filed: Mar. 2, 1987

Related U.S. Application Data

(60) Continuation-in-part of application No. 06/262,542, filed on May 11, 1981, now Pat. No. 4,677,345, which is a division of application No. 06/178,107, filed on Aug. 14, 1980, now abandoned.

(51) Int. Cl.
*H01J 7/44* (2006.01)

(52) U.S. Cl. .................. 315/72; 315/56; 315/58; 315/244; 315/DIG. 5

(58) Field of Classification Search .......... 315/56, 315/72, 244, 53, 57, 58, 200 R, 209, 227 R, 315/232, 242, 241 R, 243, 219–220, 276, 315/278, 279, DIG. 5, DIG. 7; 331/113 A
See application file for complete search history.

(56) References Cited

U.S. PATENT DOCUMENTS

| | | |
|---|---|---|
| D113,357 S | 2/1939 | Babb |
| 2,333,499 A | 11/1943 | Warren |
| 2,990,519 A | 6/1961 | Wagner |
| 3,084,283 A | 4/1963 | Grunwaldt |
| 3,146,406 A | 8/1964 | Wilting |
| 3,263,122 A | 7/1966 | Genuit |
| 3,317,856 A | 5/1967 | Wilkinson |
| 3,551,736 A | 12/1970 | Doehner |
| 3,609,452 A | 9/1971 | Skirvin |
| 3,611,021 A | 10/1971 | Wallace |
| 3,691,450 A | 9/1972 | Cox |
| 3,733,541 A | 5/1973 | Elms |
| 3,753,071 A | 8/1973 | Engel |
| 3,882,356 A | 5/1975 | Stehlin |

(Continued)

FOREIGN PATENT DOCUMENTS

| | | |
|---|---|---|
| DE | 1964290 U | 7/1967 |
| DE | 1964290 | 6/1971 |
| DE | 2747115 A1 | 4/1979 |
| DE | 29 45 245 A1 | 5/1980 |
| EP | 0 059 064 B1 | 10/1985 |
| FR | 2441290 A1 | 6/1980 |
| GB | 2003314 A | 3/1979 |
| GB | 2 038 570 A1 | 7/1980 |
| GB | 2048559 A | 12/1980 |
| JP | 52-100769 | 8/1977 |
| NL | 7709264 | 2/1979 |

OTHER PUBLICATIONS

Memorandum Opinion and Order—Judge John W. Darrah (Jun. 28, 2006); *Nilssen v. Osram* (01 C 3585).

Ole K. Nilssen, et al., v. *Osram Sylvania, Inc., et al.*, __F.3d__, No. 2006–1550 (Fed. Cir. Oct. 10, 2007).

(Continued)

*Primary Examiner*—Ovidio Escalante

(57) ABSTRACT

A fluorescent lamp is mounted on an ordinary Edison-type screw-base; which screw-base contains a frequency-converting electronic ballast. The combined lamp-ballast-assembly is adapted to be used in an ordinary screw-in lamp socket powered from ordinary 120 Volt/60 Hz power line voltage. The frequency-converting ballast within the screw-base converts the 120 Volt/60 Hz power line voltage to a high-frequency (20–30 kHz) substantially sinusoidal current, which is then used for powering the compact fluorescent lamp.

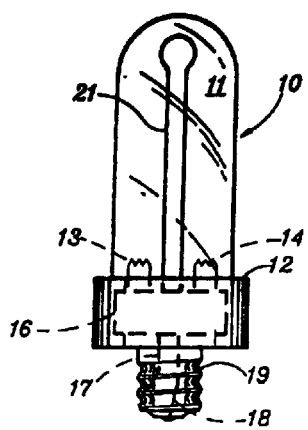

U.S. PATENT DOCUMENTS

| | | | |
|---|---|---|---|
| 3,987,335 A | 10/1976 | Anderson |
| 4,005,335 A | 1/1977 | Perper |
| 4,053,813 A | 10/1977 | Kornrumpf |
| 4,060,751 A | 11/1977 | Anderson |
| 4,075,476 A | 2/1978 | Pitel |
| 4,093,893 A | 6/1978 | Anderson |
| 4,100,476 A | 7/1978 | Ghiringhelli |
| 4,151,445 A | 4/1979 | Davenport |
| 4,199,708 A | 4/1980 | Lauwerijssen |
| 4,208,604 A | 6/1980 | Couwenberg |
| 4,237,403 A | 12/1980 | Davis |
| 4,244,013 A | 1/1981 | Wotowiec |
| 4,251,752 A | 2/1981 | Stolz |
| 4,266,134 A | 5/1981 | Franke |
| 4,270,071 A | 5/1981 | Morton |
| 4,277,728 A | 7/1981 | Stevens |
| 4,300,073 A | 11/1981 | Skwirut |
| 4,330,819 A | 5/1982 | Foch et al. |
| 4,350,930 A | 9/1982 | Peil |
| 4,353,007 A | 10/1982 | Moerkens |
| 4,375,607 A | 3/1983 | Morton |
| 4,461,980 A | 7/1984 | Nilssen |
| 4,546,284 A | 10/1985 | Renardos |
| 4,857,806 A | 8/1989 | Nilssen |

OTHER PUBLICATIONS

Hirschmann, W., Technische Mitteilung aus dem Bereich Bauelemente, (Siemens AG) (1978) (excerpted pages).

Rule 26(A)(2)(B) Expert Report of Robert Burke (Jul. 11, 2005); *Nilssen* v. *Universal Lighting Technologies, Inc.* (Civil Case No. 3:04–0080).

Rule 26(A)(2)(B) Expert Report of Carlile R. Stevens (Jul. 11, 2005); *Nilssen* v. *Universal Lighting Technologies, Inc.* (Civil Case No. 3:04–0080).

Dale et al., "Conversion of Incandescent Lamp Sockets to Fluroscent in the Home Market," Lighting & Design Application, Mar. 1976.

Rule 26(A)(2)(B) Expert Report of Carlile R. Stevens (Nov. 13, 2003); *Nilssen* v. *Osram Sylvania, Inc.* (C. A. No. 01–C–3835).

Supplemental Expert Report of Carlile R. Stevens (Aug. 1, 2005); *Nilssen* v. *Osram Sylvania, Inc.* (C. A. No. 01–C–3835).

Netherlands app. No. 7709254.

UK app. No. 2003314A.

UK app. No. 2048559A.

German app. No. 2747115A1.

Magazine Article by Dale dated Mar. 1976.

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

The patentability of claims 1–14 and 17–19 is confirmed.

Claims 15, 16, 20 and 21 are cancelled.

\* \* \* \* \*